US008363417B2

(12) United States Patent  (10) Patent No.: US 8,363,417 B2
Gunderson et al.  (45) Date of Patent: Jan. 29, 2013

(54) PCBA LOW COST SNAP-ON FRAME MOUNT

(75) Inventors: Neal Frank Gunderson, Lake Elmo, MN (US); Wolfgang Rosner, Burnsville, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 324 days.

(21) Appl. No.: 12/717,235

(22) Filed: Mar. 4, 2010

(65) Prior Publication Data

US 2011/0216511 A1   Sep. 8, 2011

(51) Int. Cl.
H05K 5/00 (2006.01)
H05K 1/14 (2006.01)
A47B 81/00 (2006.01)

(52) U.S. Cl. ........ 361/752; 361/732; 361/736; 361/740; 361/741; 361/742; 361/679.38; 361/679.39; 361/679.57; 312/223.2

(58) Field of Classification Search .. 361/679.31–679.4, 361/679.55–679.6, 724–752, 679.02, 679.03, 361/807–813; 439/60, 151–160, 327, 328, 439/331, 638
See application file for complete search history.

(56) References Cited

U.S. PATENT DOCUMENTS

| | | |
|---|---|---|
| 3,304,109 A | 2/1967 | Schuster |
| 4,470,737 A | 9/1984 | Wollar |
| 4,842,508 A | 6/1989 | Boskovic |
| 5,419,667 A | 5/1995 | Avgoustis |
| 5,603,515 A | 2/1997 | Bock |
| 5,709,513 A | 1/1998 | Tsai |
| 5,763,949 A | 6/1998 | Woodworth et al. |
| 5,886,397 A | 3/1999 | Ewer |
| 6,215,074 B1 | 4/2001 | Good et al. |
| 6,361,330 B1 | 3/2002 | Badcock et al. |
| 6,385,036 B1 | 5/2002 | Chien |
| 6,556,433 B1 | 4/2003 | Love et al. |
| 6,639,796 B2 | 10/2003 | Cannon |
| 6,826,045 B2 | 11/2004 | Chen |
| 7,125,231 B1 | 10/2006 | Kuhn |
| 7,301,776 B1 | 11/2007 | Wang et al. |
| 7,517,231 B2 | 4/2009 | Hiew et al. |
| 2008/0038877 A1 | 2/2008 | Wang et al. |
| 2008/0266816 A1* | 10/2008 | Ni et al. ........................ 361/737 |
| 2009/0091882 A1* | 4/2009 | Liu et al. .................. 361/679.33 |

* cited by examiner

*Primary Examiner* — Jayprakash N Gandhi
*Assistant Examiner* — Jerry Wu
(74) *Attorney, Agent, or Firm* — Hall Estill

(57) ABSTRACT

The present invention is directed to a printed circuit board assembly having a circuit board with opposing side edges and an open frame housing with parallel mounting frames extending along the side edges of the circuit board. Each mounting frame has a body portion having a support shelf and an overhang ledge forming a channel, the channel nesting an associated side edge of the circuit board. A mounting peg is supported to extend transversely to the entry of the channel, and temporary deforming of the ledge permits entry of the associated side edge into the channel, the circuit board having a complementary peg retention hole appropriately sized to receive the mounting peg.

21 Claims, 7 Drawing Sheets

US 8,363,417 B2

PCBA LOW COST SNAP-ON FRAME MOUNT

SUMMARY OF INVENTION

Various embodiments of the present invention are directed to a printed circuit board assembly having an open frame housing of parallel mounting frames that extend along opposing side edges of a circuit board. Each mounting frame has an elongated body member having a support shelf and an overhang ledge forming a channel, the channel nesting an associated side edge of the circuit board.

Each mounting frame has a mounting peg is supported by the body member to extend transversely to the entry of the channel wherein temporary deforming of the ledge permits entry of the associated side edge into the channel, the circuit board having a complementary peg retention hole appropriately sized to receive the mounting peg therein.

The several embodiments feature varying shapes of the mounting pegs and complementary peg retention holes. One embodiment provides for top down assembly and features a rotatable ledge to open the channel for top down entry of an associated circuit board side edge.

These and various other features and advantages which characterize the claimed invention will be apparent from a reading of the following detailed description and a review of the associated drawings.

DETAILED DESCRIPTION

Numerous possible variations and modifications will readily occur to the skilled artisan upon a review of the following discussion. Thus, it will be understood that the various exemplary embodiments disclosed herein are illustrative of and are not limiting to the scope of the invention.

Solid state drives (sometimes referred to as SSD's) have a significant cost per unit of memory (gigabyte, GB) disadvantage relative to disc drives. This is especially apparent for applications in notebook or netbook computers in which space becomes a premium, yet marketing pressures bear heavily on costs. The design of an SSD for these applications has only a printed circuit board assembly (sometimes referred to as a PCBA), an I/O connector and side frames for mounting.

The side frames, the only mechanical component of such printed circuit board assemblies, can be molded of an acceptable plastic and attached to the PCBA by means of mechanical fasteners, such as screws. But in some small form factor (SFF) specifications, it is desirable to eliminate the use of fasteners, and for such installations this can be achieved by providing slip and snap fit slots or holes in the PCBA, and embodiments featuring this will described herein, in which, preferably, the PCBA slots are shaped for one or more of the purposes of orientation, registration and facilitation of assembly. In such cases, the side frames are provided with mating features that are pushed into PCBA slots (holes) during assembly, thus supporting the PCBA and connector in the correct form factor location.

Figure 1:
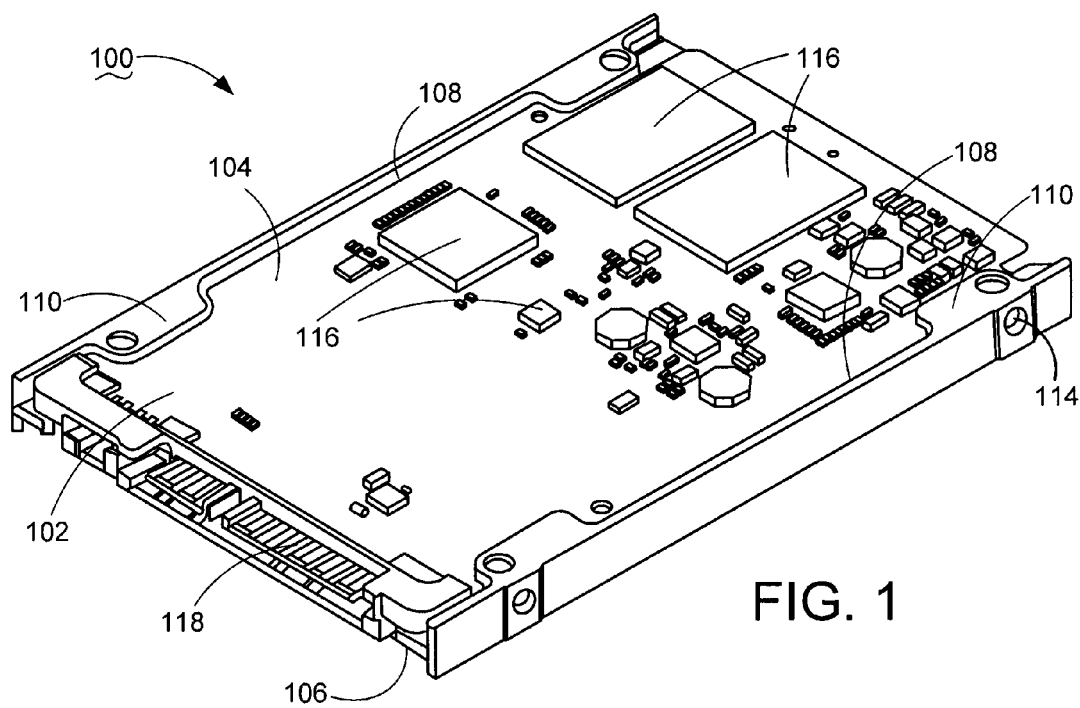
FIG. 1 is a front isometric view of a printed circuit board assembly of the type to be described with the various embodiments of the present invention.
Figure 2:
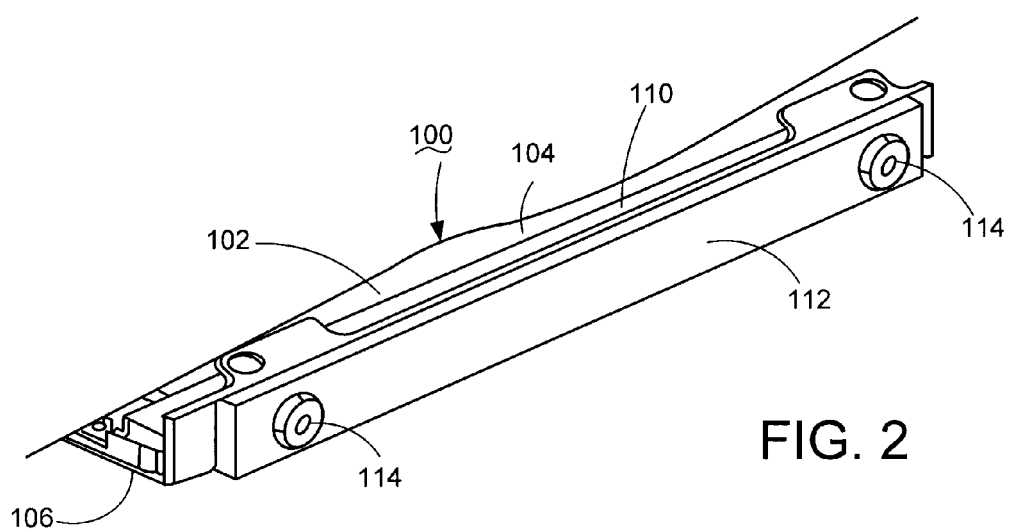
FIG. 2 is a partial isometric view of the printed circuit board assembly of FIG. 1 mounted in a mounting frame and supported in a rack frame of a host system.

Attention will now be directed to the drawings in general and to FIGS. 1 and 2 in particular wherein is shown a printed circuit board assembly 100. For convenience of reference this will sometimes be referred to as the PCBA 100, which has a circuit board 102 having a planar top surface 104, a planar bottom surface 106 and side edges 108.

A pair identically constructed parallel elongated mounting frames 110 are shown respectively extending along and nesting the side edges 108. In the manner that will be described herein below, the mounting frames 110 together form an open frame housing (that will sometimes also be referred to as the open frame housing 110) for support of the circuit board 102. A rack frame 112 of a host system (not further shown) is depicted with a pair of screw members 114 extending through holes (not separately numbered) therein and engaged with holes in the mounting frames 108.

The PCBA 100, as depicted, has a plurality of electronic devices 116, such as non-volatile memory chips, mounted to one or both of the upper and bottom surfaces, 104, 106, and a connector 118 is mounted to one end.

Figure 3:
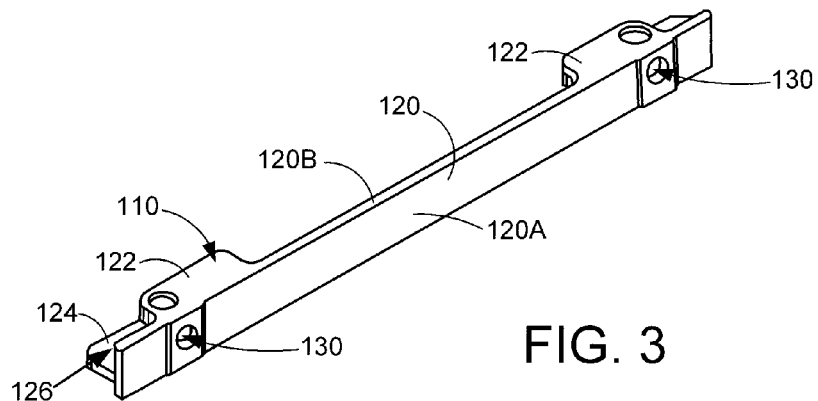
FIG. 3 is an enlarged isometric view of one of the elongated parallel mounting frames of the printed circuit board assembly of FIG. 1.
Figure 4:
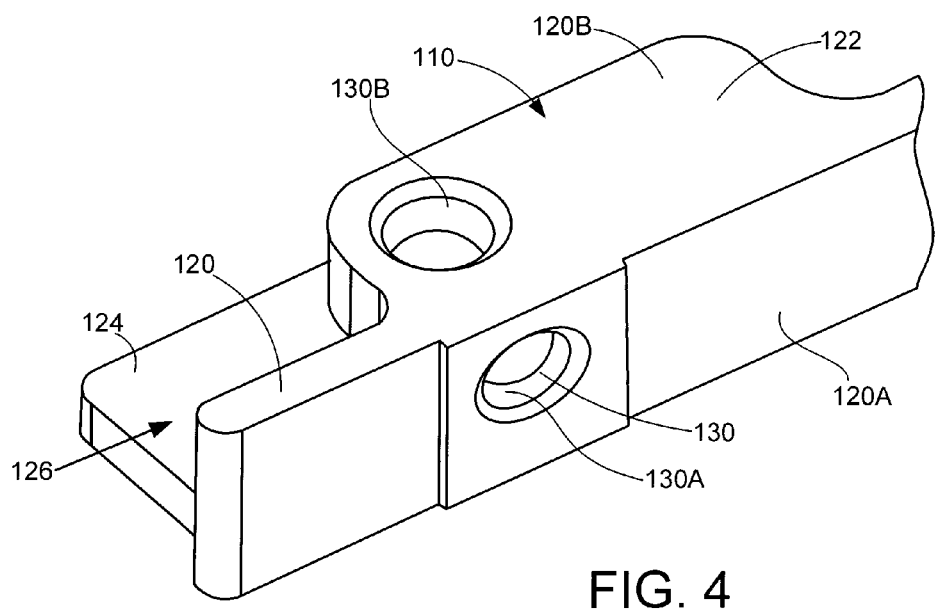
FIG. 4 is a partial, enlarged end of the mounting frame of FIG. 3 showing multiple molded molded-in hole levels.

With reference to FIGS. 3 and 4, it will be noted that each of the mounting frames 110 has a body portion 120 having a pair of inwardly extending overhang protrusions 122 and a support ledge portion 124 that longitudinally extends substantially the length of the body portion 120. Between the body protrusions 122 and the support ledge 124 is a channel 126 effectively extending substantially the length of the mounting frame 110. The clearance dimension of the channel 126 (the distance between the body protrusions 122 and the support ledge 124) is determined to accept the thickness dimension of the circuit board 102 so that the side edges 108 thereof will nest in the channel 126 as shown in FIG. 1.

The body portion 120 has a first planar surface 120A and a second planar surface 120B that is substantially normal to the first planar surface 120A. In the board mounted position depicted in FIG. 1 (with the circuit board 102 nested in the channels 126), the first planar surface 120A is substantially normal to the planar top and bottom surfaces 104, 106, and the second planar surface 120B is substantially parallel to the planar top and bottom surfaces 104, 106.

Each mounting frame 110 has a pair of orthogonally extending bores 130 that extend through the body portion 120, each bore 130 featuring multilevel portions with the complex hole geometry of this invention. That is, each bore 130 is formed of a first mounting hole 130A in the first planar surface 120A and a second mounting hole 130B in the second planar surface, the first and second mounting holes 130A, 130B being orthogonally disposed holes that extend into the body portion 120 and intersect in the manner described with regard to FIGS. 5 through 8 as follows.

Figure 5:
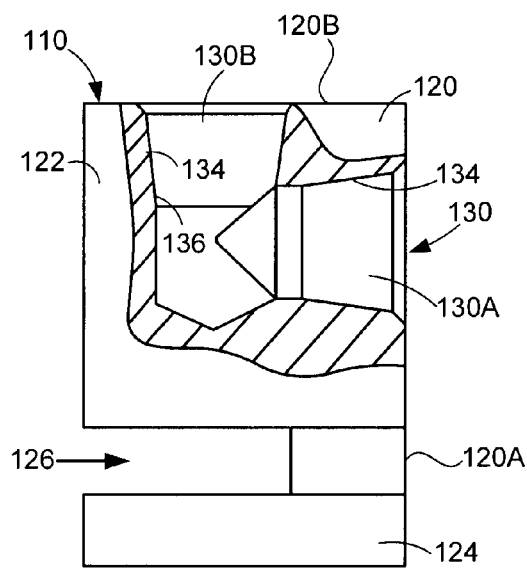
FIG. 5 is a partially cutaway, end elevation view of the mounting frame of FIG. 3 in which the mounting holes are tapered, multilevel holes.

FIG. 5 shows the mounting holes 130A and 130B of multilevel mounting bore 130, wherein each mounting hole 130A, 130B has multiple molded-in levels or diameters, with each having a tapered entry portion 134 and an inner portion 136. While only two multilevels (130A and 130B) are depicted, there can be as many levels necessary.

The diameter of the outer portion 134, at its smallest span, may be substantially equal to, or slightly larger than, the major thread diameter of the screw being used, while the inner portion 136 may have a diameter substantially equal to, or slightly less than, the minor thread diameter of the screw. With the tapered entry portion 134, the screw will be guided to the inner portion 136 where the screw can self tap the required threads to secure it in place.

Figure 6:
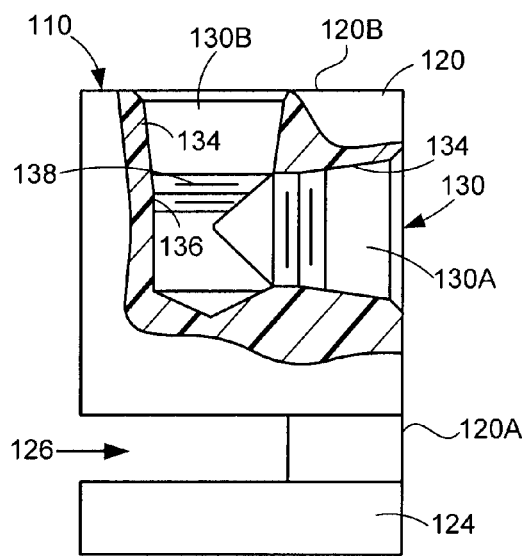
FIG. 6 is a partially cutaway, end elevation view of the mounting frame of FIG. 3 in which the mounting holes are tapered, multilevel holes with a threaded inner portion.

In FIG. 6, each of the mounting holes 130A and 130B has a tapered entry portion 134 and an inner portion 136 in the same manner as that of FIG. 5, but differs by having threads 138 added at the inner portion 136; of course, the treads 138 can, if desired, be started at the inner end of the tapered entry portion 134 and continued into the inner portion 136, as may be required for any particular installation. The diameter of the outer portion 134, at its smallest span, is preferably substantially equal or slightly less than the major thread diameter of the screw being used, while the inner portion 136 has a few full threads 138 that are engagable with the screw that is used to connect to the rack frame 112.

Figure 7:
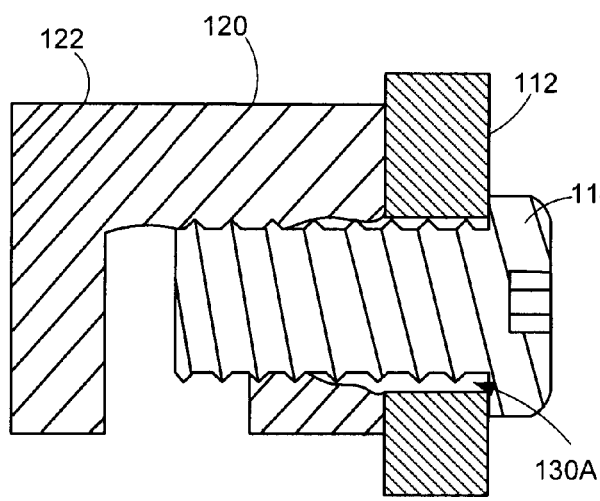
FIG. 7 is a partial, cutaway view of a screw in threaded engagement with a multilevel molded-in hole.

According to the aspects illustrated, the mounting bores 130 may be molded tapered holes of multilevel holes, allowing entry guiding and easy starting engagement of a screw, since the top of the hole is substantially equal to or greater than the major diameter of the screw at its largest span. This is illustrated in FIG. 7 in which is depicted the screw member 114 engaged in the mounting hole 130A.

This view (FIG. 7) is a cross sectional view of the intersecting, multilevel side mounting hole for self tapping with the screw 114 attaching the mounting frame 110 to the rack frame 112. It will be noted that the hole 130A has three different levels of engagement of the screw threads from light engagement near the entry level of the hole and with heavy thread engagement at the innermost end of the hole. That is, only in the bottom portion of the hole 130A is the diameter smaller or substantially equal to the minor diameter of the screw such that the screw will start tapping threads as the screw has sufficiently entered the mounting hole to be uprightly set so that its longitudinal axis is substantially coincident with the central axis of the hole.

When provided in the inner portion of the hole, the threads can be formed for tight engagement with the screw so that the screw will be secured therein by application of an acceptable level of torque force and without the use of special self tapping screws. It is recognized that, with a tapered hole having only the last few threads fully formed, there may be applications where this is insufficient to prevent the threads stripping during installation or not provide sufficient gripping force for some ranges of op and non-op shock or vibration activities, so that it may be necessary, as mentioned above, to dimension the hole and increase the thread reach to extend further toward the entry of the hole.

Figure 8:
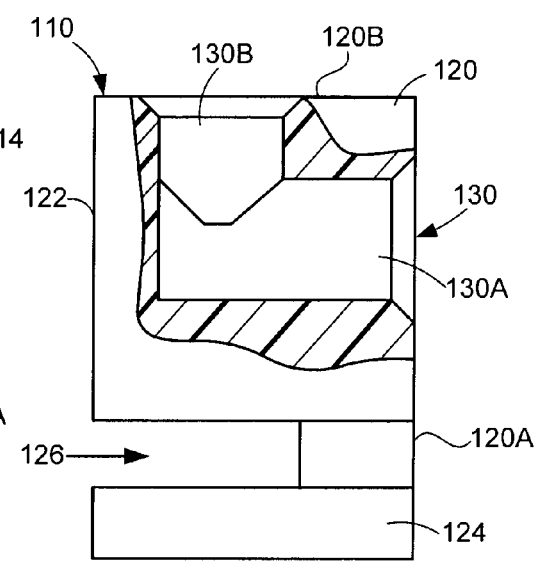
FIG. 8 is a partially cutaway, end elevation view of another multilevel hole provided for non-threaded engagement.

Another possible attachment is described with reference to FIG. 8, which facilitates some mounting applications in which, for cost and speed of assembly, screws are not used for attaching the open frame housing to a rack frame as described above. However, the mounting holes 130A, 130B serve as locating/holding features for pins or protrusions. For such applications, the mounting holes 130A and 130B may be formed of substantially uniform diameter along the length of the mounting bore 130.

The use of fasteners, such as illustrated by FIGS. 1-8, offers several benefits, such as it being relatively easy to mold in the complex hole geometry described herein for the mounting holes 130A and 130B of the mounting bore 130 by using a simple shaped pin supported during molding but removable by a straight pull out following molding, as that used for a cylindrical pin in a straight hole in any plastic molded part.

The multiple rings of the multiple molded-in levels of the holes 130A, 130B, as depicted in FIG. 4, give both a circumferential and vertical/horizontal change in degree of screw engagement. This provides self-centering of the screw, and easy thread cutting since only partial and shallow threads are cut in the first ring's largest diameter levels. At lower levels, deeper and fuller threads will be cut as the screw is inserted. The partial threads that are cut by the screw nearer the top of the hole, and the fuller threads at the bottom of the hole, serve to provide strength of engagement, and importantly, provide a large design space of possible configurations to allow for design trade-offs and optimization. There can thus be more or fewer rings and more or fewer levels circumferentially as required for a particular specification.

Figure 9:
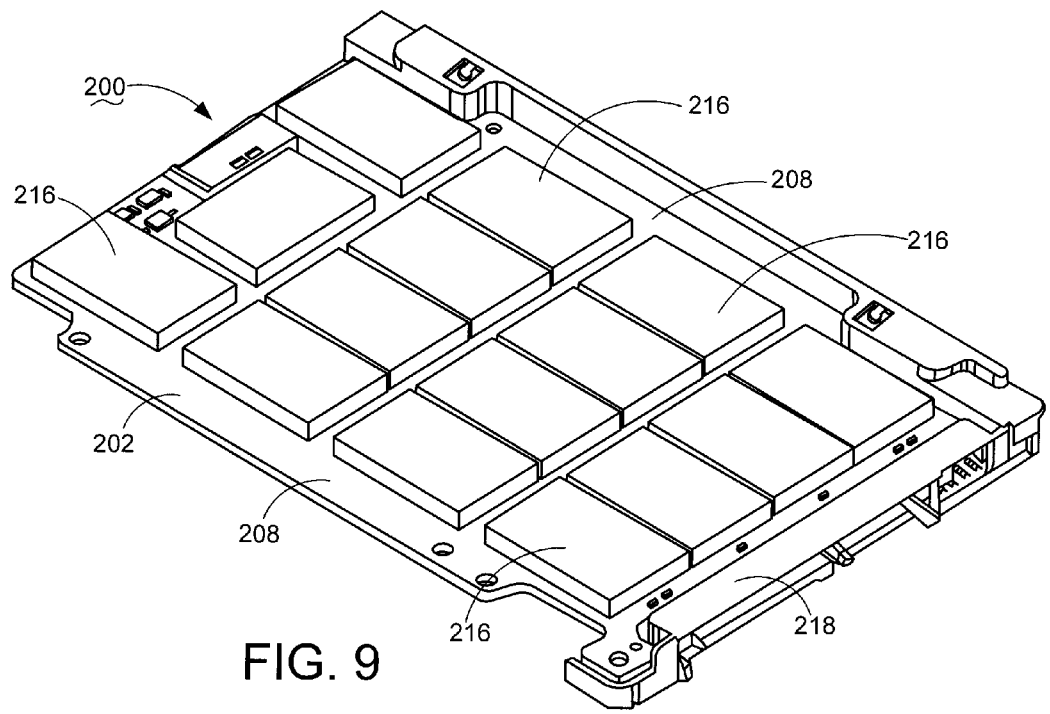
FIG. 9 is a front isometric view of a printed circuit board assembly constructed in accordance with various embodiments of the present invention.
Figure 10:
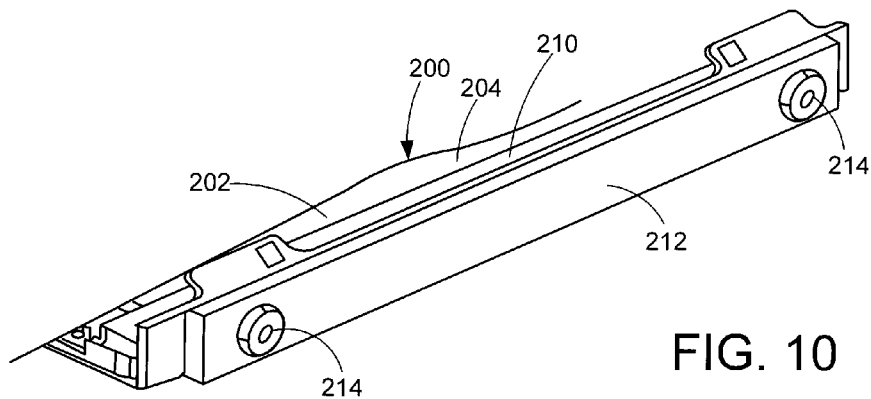
FIG. 10 is a partial isometric view of the printed circuit board assembly of FIG. 9 mounted in a mounting frame and supported in a rack frame of a host system.

Attention will now be directed to FIGS. 9-16 in general for the description of various embodiments of the present invention. More specifically, FIGS. 9 and 10 show a printed circuit board assembly 200 (which for convenience of reference will sometimes be referred to as the PCBA 200) having a circuit board 202 with planar top and bottom surfaces 204 (only the bottom surface is viewable) and opposing side edges 208.

A pair of parallel elongated mounting frames 210 (only one shown in FIG. 9) extend along and nest the opposing side edges 208. In the manner described herein, the pair of mounting frames 210 forms an open frame housing (that will sometimes also be referred to as the open frame housing 210) for support of the circuit board 202. A rack frame 212 of a host system (not further shown) is depicted with a pair of screw members 214 extending through holes (not separately numbered) therein and engaged with retention holes in the mounting frames 210.

The PCBA 200, as depicted, has a plurality of electronic devices 216, such as memory chips, mounted to one or both of the upper and bottom surfaces 208 of the circuit board 202, and a connector 218 is mounted to one end thereof.

Figure 11:
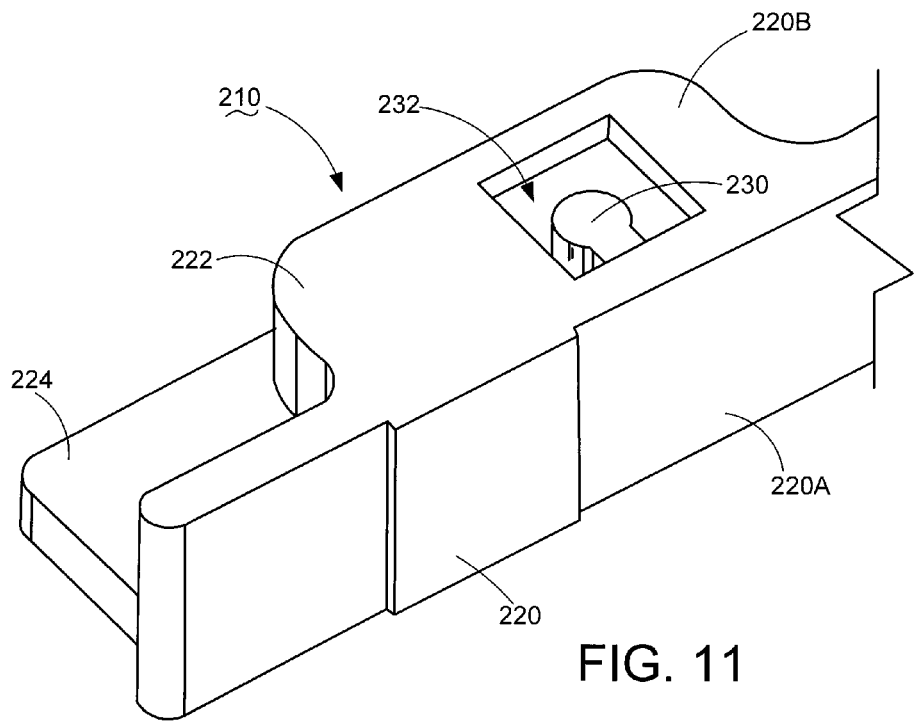
FIG. 11 is a partial, enlarged end of the mounting frame of FIG. 10.
Figure 12:
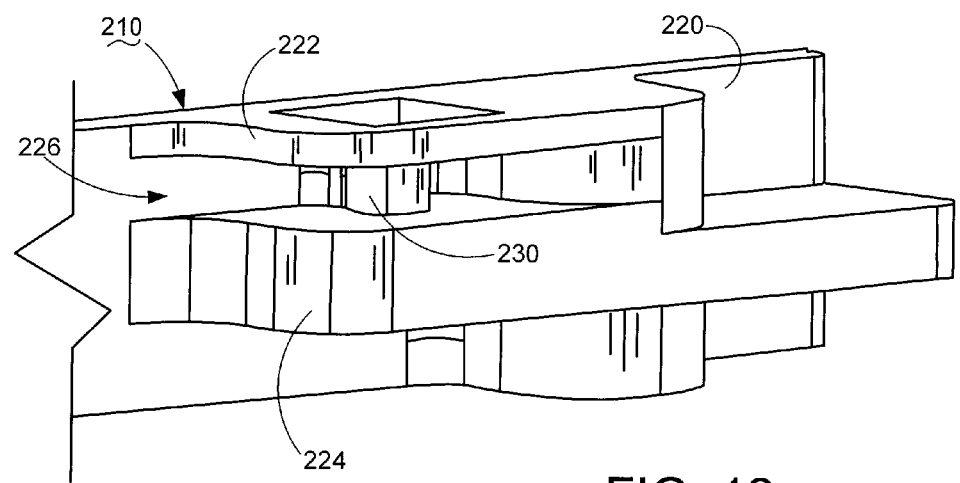
FIG. 12 is another partial, enlarged end of the mounting frame of FIG. 10.

FIGS. 11 and 12, exemplary of another aspect of the present invention, show an end portion of one of the mounting frames 210, and the following description of this end portion will equally apply to and describe the other end of the mounting frame 210. Each mounting frame 210 has a body portion 220 that has a pair of inwardly extending overhang ledge protrusions 222 and a support shelf portion 224 that longitudinally extends along the length of the body portion 220. Between the overhang ledges 222 and the support shelf 224 are channels 226 effectively extending substantially the length of each overhang ledge 222. The clearance dimension of the channels 226 (the distance between the ledges 222 and the support shelf 224) is determined to accept the thickness dimension of the circuit board 202 so that the side edges 208 will nest in the channels 226 as depicted in FIG. 9.

The body portion 220 has a first planar surface 220A and a second planar surface 220B substantially normal to the first planar surface 220A. In the board mounted position depicted in FIG. 9 (with the circuit board 202 nested in the channels 226), the first planar surface 220A is substantially normal to the planar top and bottom surfaces 204, and the second planar surface 220B is substantially parallel to the planar top and bottom surfaces 204.

As noted, a purpose of the embodiment of the invention illustrated in FIGS. 11 and 12 is the elimination of the PCBA mounting screws discussed herein above, and the mounting frames that will now be described are designed to achieve that purpose. The mounting frames 210 are preferably molded of an acceptable polymeric, or plastic, material and have keyhole shaped mounting pegs 230, one of which is shown in FIGS. 11 and 12, preferably integrally molded with the body portion 220 and orthogonally disposed to the channel 226, thereby extending transversely to the entry of the associated side edge 208 into the channel 226.

The mounting pegs 230, positioned to extend from the support shelf 224 transversely to the channel 226, cooperate with crushable, or flexible, features in the mounting frames 210 that, as will be hereafter described, assures a firm fit of the mounting frames 210 for a full range of thickness tolerance of the circuit board 202. Thus, the PCBA 200 and its connector 218 are held in the correct form factor locations, with the tight fit preventing movement of the PCBA 200 relative to the side mounting frames 210.

The mounting pegs 230 are preferably molded in the shape shown, that is, molded to have a cross-sectional shape of a traditional keyhole, and complementary keyhole shaped peg retention holes (not shown) are disposed in the circuit board 202 to receive the keyhole mounting pegs 230. The keyhole shape serves to position and orient the mounting frame 210, as one side edge 208 of the circuit board 202 is pressed into the channels 226 until the mounting peg 230 registers with, and inserts into, the peg retention hole.

It should be noted that the keyhole peg 230 is viewable in FIGS. 11 and 12 through an access hole 232 in the overhead ledge 222. The access hole 232 is the result of required access to mold the keyhole peg 230 during the molding process, and this access hole is deemed otherwise unnecessary for the present invention.

It should be noted that the thickness of the overhanging ledge 222 shown in FIG. 12 is thinner than the thickness of the support shelf 224. These thickness dimensions will be determined by the material selected from which the mounting frames 210 are molded. The dimensions of the support shelf 224 are determined so as to achieve rigid stability, while the dimensions of the overhang ledges 222 are determined so that each ledge 222 can be flexed, or temporarily lifted, to provide access of the side edge 208 of the circuit board 202 into the channel 226 as it is pressed over and onto the keyhole mounting pegs 230.

The flexibility of the ledges 222 permit this lifting, and once the keyhole mounting pegs 230 are seated in the keyhole shaped holes of the circuit board 208, the elasticity of the ledges 222 will return them to their stable, pre-flexed state, with the side edges of the circuit board 202 locked in position in the channels 226. Removal of the circuit board 202 from the mounting frames 210 is achieved simply by flexing the ledges 222 upward and removing the circuit board from engagement with the mounting pegs 230 and from the channels 226.

Figure 13:
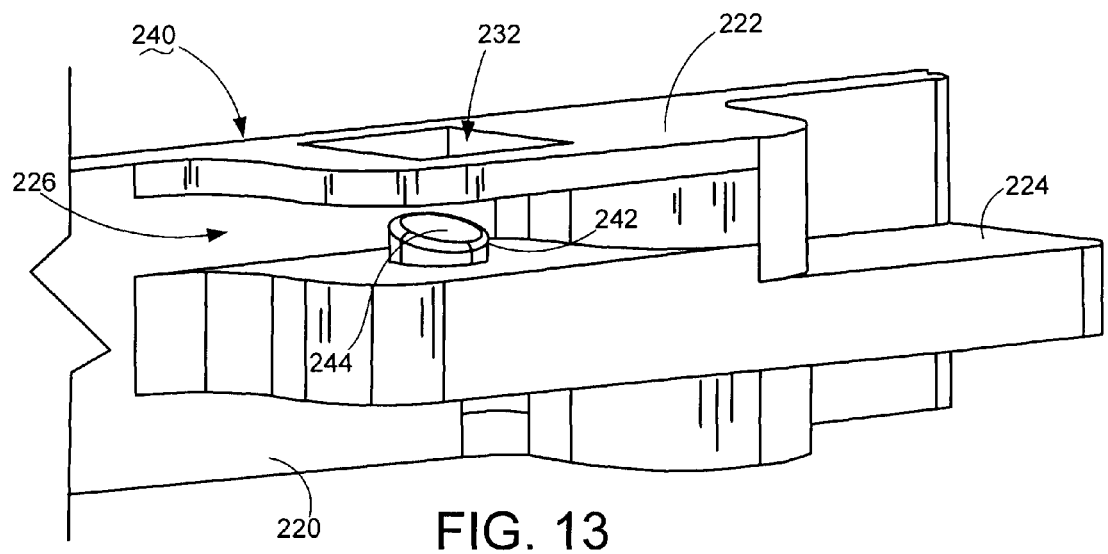
FIG. 13 is a partial, enlarged end of another mounting frame embodiment of the present invention.
Figure 14:
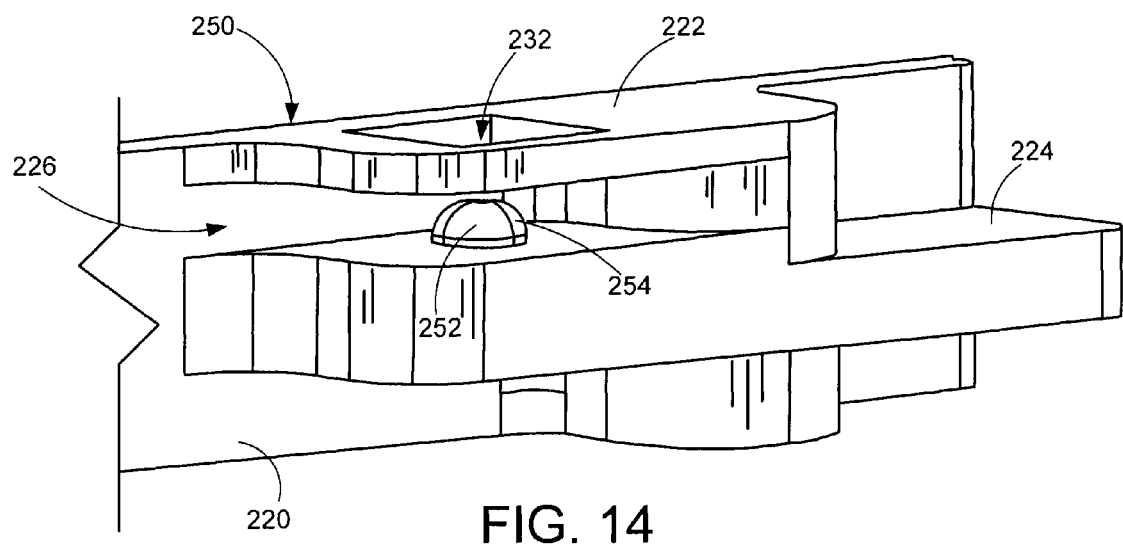
FIG. 14 is a partial, enlarged end of yet another mounting frame embodiment of the present invention.
Figure 15:
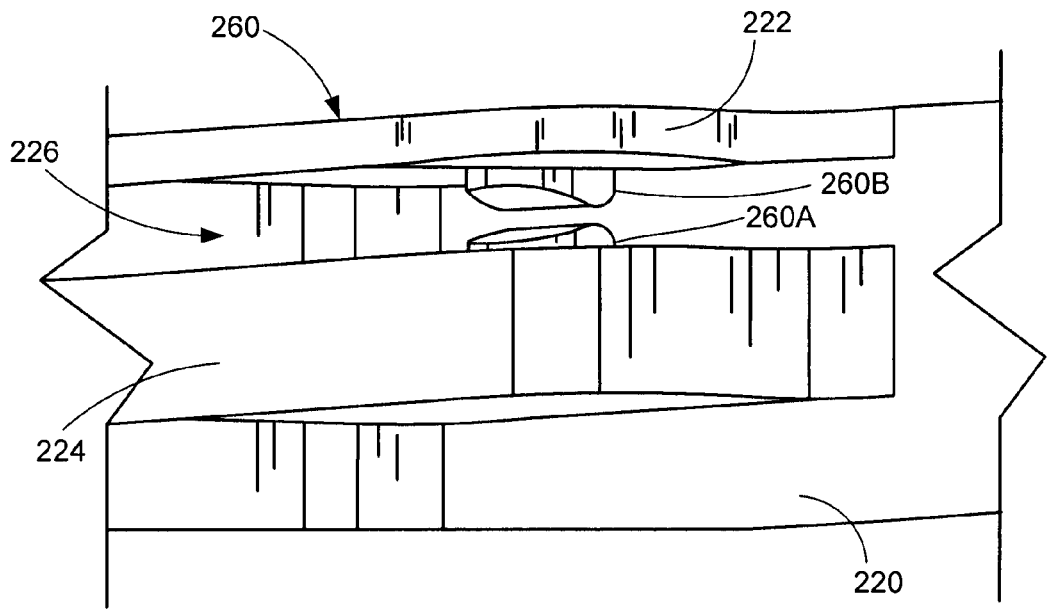
FIG. 15 is a partial, enlarged end of one other mounting frame embodiment of the present invention.

Shown in FIGS. 13 through 15 are alternative embodiments of the invention, each having variant mounting pegs to the keyhole mounting pegs 230 of the mounting frames 210. The component portions of the embodiments of FIGS. 13-15 share those of the mounting frames 210 described above, so like numbers will be used therefor.

An end portion of one of a pair of parallel elongated mounting frames 240 is shown in FIG. 13 that, in the manner of the mounting frames 210, extend along and nest the opposing side edges 208 to form an open frame housing (sometimes referred to as the open frame housing 240) for support of the circuit board 202. The open frame housing 240 is attachable to the host rack frame 212 via the screw members 214 extending through holes in the mounting frames 240. Each mounting frame 240 has a body portion 220, a pair of inwardly extending overhang ledge protrusions 222 and a support shelf portion 224 extending along the length of the body portion 220 and forming channels 226 dimensionally determined to accept the side edges 208 of the circuit board 202.

The mounting frames 240 have generally cylindrically shaped mounting pegs 242, one shown in FIG. 13, for engagement with appropriately shaped complementary circular holes (not shown) in the circuit board 202. The cylindrical mounting pegs 242 are preferably integrally molded with the body portion 220 to extend upward from the support shelf 224 transversely to the entry of the associated side edge 208 into the channel 226. Each cylindrical peg 242 has a top surface 244 shaped to incline toward the entry of the channel 226 so as to engage against the side edge 208 as the circuit board 202 is pressed into the channels 226.

The inclined top surfaces 244 serves to direct the entering circuit board side edge 208 to provide an upward force vector against the under surface of the overhanging flexible ledges 222, thus facilitating the nesting of the side edges of the circuit board in the channels 226. Once nesting has occurred and the cylindrical mounting pegs 244 have seated in the appropriately disposed holes in the circuit board 202, the elasticity of the ledges 222 will return them to their pre-flexed state.

The embodiments of the invention shown in FIGS. 14 and 15 vary in construction to the mounting frame 240 of FIG. 13 only in the shape of the mounting pegs. An end portion of a mounting frame 250 shown in FIG. 14 has preferably integrally molded dome shaped mounting pegs 252 that register with complementary circular holes in the associated side edge 208. The dome shaped mounting pegs 252, with curved upper surfaces 254, extend from the support shelf 224 transversely to the entry of the associated side edge 208 into the channel 226.

The upper curved surfaces 254 serve to achieve the same function as the inclined surfaces 244 of the dome mounting pegs 242 of FIG. 13; that is, the upper curved surfaces 254 direct the entering circuit board side edge 208 with an upward force vector against the under surface of the overhanging flexible ledges 222, thereby enlarging the entry of the channels 226 to facilitate nesting of the side edges of the circuit board 202 in the channels 226 of the mounting frames 250. Once the circuit board is in place in the channel 226, the ledges 222 will return to their pre-flexed state.

In the embodiment of FIG. 15, an end portion of a mounting frame 260 is shown in FIG. 15 having a pair of cylindrically shaped, coaxially aligned, preferably integrally molded mating mounting pegs 262A and 262B, with the mounting peg 262A molded to extend up from the support shelf 224 and the mounting peg 262B molded to extend down from the overhanging ledge 222 and axially aligned with the mounting peg 262A, each extending transversely to the entry of the associated side edge 208 into the channel 226. The end surfaces of the mating mounting pegs 262A and 262B are inclined as discussed above for ease of pressing the side edges 208 into the channels 226 of the mounting frame 260, and complementary circular shaped holes are provided in the side edges 208 to receive the mounting pegs 262A, 262B therein.

Figure 16:
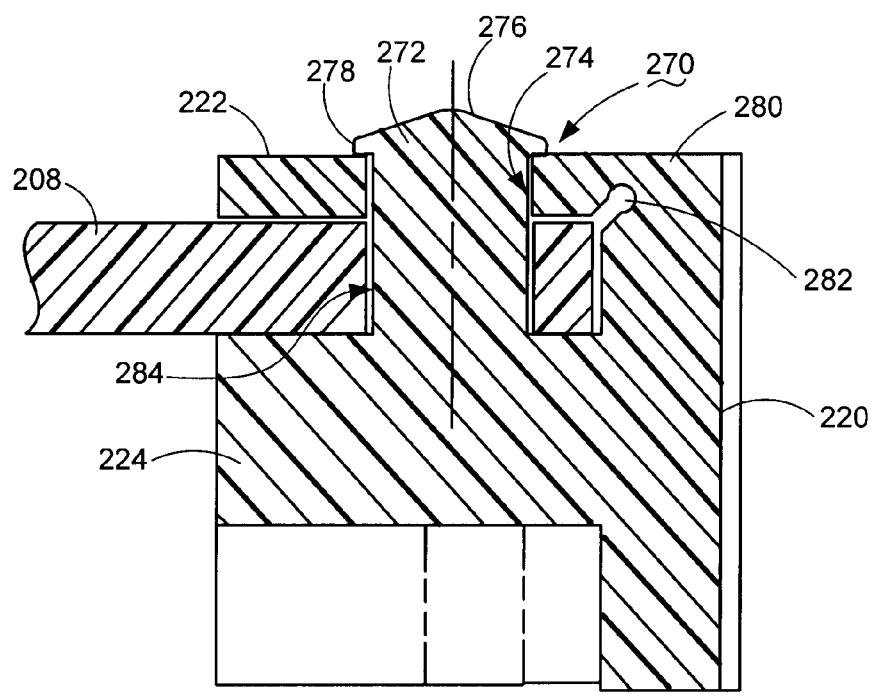
FIG. 16 is a cross-sectional view of one further mounting frame embodiment of the present invention

FIG. 16 shows yet another embodiment of a mounting frame having a hinged overhang ledge. As with the other embodiments, the same numbers will be employed in describing a mounting frame 270 having mounting pegs 272, each preferably molded to extend from the support shelf 224 to insert into a ledge hole 274 in the overhang ledge 222 and each extending transversely to the entry of the associated side edge 208 into the channel 226. Each mounting peg 272 has a head portion 276 with an overlapping lip 278.

The ledge 222 is connected to the body portion 220 by a hinge portion 280 that is formed by an undercut groove 282. The hinge 280 permits the rotation of the ledge 222 toward the mounting peg to assume a peg engaged mode and away from the mounting peg 272 to assume a peg disengaged mode. The side edge 208 of the circuit board 202 has a complementary peg retention hole 284 that is dimensioned for passage there through of the mounting peg 272, as shown.

Once the side edge 208 is in position over the mounting peg 272, the ledge 222 can be rotated toward the mounting peg 272 to extend the mounting peg through the ledge hole 274 (this is the peg engaged mode). This permits top down insertion of the circuit board 202 into the channel 226, facilitating automated assembly.

The mounting peg head portion 276 and lip 278 are configured so that the mounting peg head portion 276 and lip 278 can readily pass through the ledge hole 274 as ledge 222 is moved to the peg engaged mode. The lip portion 278 is pressed through the ledge hole 274 by downward pressure on the hinged ledge 222, and once through, the lip 278 will flex back to its pre-deformed state to overlap and resist retraction of the mounting peg 272 when the ledge 222 is moved to its peg disengaged mode, as the lip 278 must be deformed to allow retraction of the mounting peg 272 from the ledge hole 274. Similarly, the circuit board 208 can be removed from the mounting peg 272 with sufficient lifting force to deform the lip 278.

In sum, the mounting frames (210, 240, 250 and 260) have molded mounting pegs with inclined or curved tops, and as the circuit board is pressed up, over or through the mounting pegs, the circuit board is snapped over the tops and onto the mounting pegs. The mounting pegs help to wedge and hold the circuit board in the mounting frames. It will also be understood that the mounting pegs, with some exception, can be constructed as embodying the crushing feature herein, in which case the mounting pegs can elastically yield as the mounting frames are pressed into the mounting plate channel, and returning to the pre-flexed shape, register in the complementary holes or slots in the side edges of the circuit board.

The elasticity of the plastic side mounted mounting frames allow for temporary distortion of the overhanging ledges, and the shapes of the mounting pegs, along with crushable, or flexible, features in the mounting frames and/or the mounting pegs above ensure a tight, snap fit of the mounting frames on the side edges of the circuit board to accommodate a full dimensional tolerance range for the thickness of the circuit board. In this way the PCBA and connector are rigidly held in the correct form factor locations; further, the tight fit prevents movement of the PCBA relative to the side mounting frames.

The further variation of the hinged plastic snap over feature holds the mounting pegs and the PCBA together. This hinged feature also accommodates top down insertion of the PCBA into the mounting frames.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of aspects of the present invention to the full extent indicated by the broad general meaning of the terms in which the appended claims are expressed. For example, the particular elements may vary depending on the particular processing environment without departing from the spirit and scope herein.

Although the embodiments described herein are directed to hardware for the support of printed circuit board assemblies, it will be appreciated by those skilled in the art that the claimed subject matter is not so limited and various other processing systems can utilize the embodiments described herein without departing from the spirit and scope thereof.

What is claimed is:

1. A printed circuit board assembly comprising: a circuit board having opposing side edges; and
    an open frame housing comprising parallel mounting frames extending along respective side edges, each mounting frame comprising:
    an elongated body member having a rigid support shelf and a flexible ledge forming a channel, adapted to contactingly nest the associated side edge of the circuit board; and
    a mounting peg supported by the body member extending transversely to the entry of the channel wherein the ledge is adapted to be temporarily deformed during insertion of the side edge of the circuit board into the channel, the circuit board having a complementary peg retention hole appropriately sized to engage the mounting peg therein to retain the inserted side edge in the channel; and
    the mounting peg has a cylindrical outer surface and an inclined end surface, the inclined end surface inclining toward a direction perpendicular to the entry of the channel.

2. The printed circuit board assembly of claim 1 wherein the mounting frame has retention holes and further comprising fastener means for mounting the open frame housing in a host system.

3. The printed circuit board assembly of claim 2 further comprising:
    a plurality of non-volatile memory chips mounted to at least one side of the circuit board; and
    a connector mounted to an end of the circuit board between the parallel mounting frames.

4. The printed circuit board assembly of claim 1 wherein the mounting pegs have a cross-sectional shape of a keyhole, and the peg retention holes in the circuit board have a complementary keyhole shape to receive the mounting pegs therein.

5. The printed circuit board assembly of claim 1 wherein the open frame housing is made of a polymeric material.

6. The printed circuit board assembly of claim 1 wherein the mounting pegs are integrally formed with the body member.

7. The printed circuit board assembly of claim 1 wherein the mounting pegs have a cylindrical outer surface, and the peg retention holes in the circuit board have a complementary circular shape to engage the mounting pegs therein.

8. The printed circuit board assembly of claim 1 wherein the mounting pegs have a dome shaped outer surface, and the peg retention holes in the circuit board have a complementary circular shape to engage the mounting pegs therein.

9. The printed circuit board assembly of claim 1 further comprising:
a second mounting peg supported by the body member extending co-axially with the first mounting peg transversely to the entry of the channel wherein temporary deforming of the ledge permits entry of the associated side edge into the channel, the peg retention hole appropriately sized to engage the first and second mounting pegs therein.

10. The printed circuit board assembly of claim 1 wherein the mounting peg has a cylindrical outer surface and a curvilinearly shaped surface extending from the cylindrical outer surface.

11. A mounting apparatus for a printed circuit board having a side edge, comprising:
a mounting frame having a body member having a rigid support shelf and a flexible ledge forming a channel contactingly nesting the side edge; and a mounting peg extending transversely to the entry of the channel wherein entry of the associated side edge into the channel temporarily deforms the ledge to facilitate passage of the associated side edge into the channel, the circuit board having a complementary peg retention hole appropriately sized to receive the mounting peg therein so that the associated side edge is retained in the channel; and
the mounting peg has a cylindrical outer surface and an inclined end surface, the inclined end surface inclining toward a direction perpendicular to the entry of the channel.

12. The mounting apparatus of claim 11 further comprising:
fastener means for securing the mounting frame in a host system.

13. The mounting apparatus of claim 11 wherein the mounting peg has a cross-sectional shape of a keyhole, and the peg retention hole in the circuit board has a complementary keyhole shape to engage the mounting peg therein.

14. The mounting apparatus of claim 11 wherein the body member is made of a polymeric material.

15. The mounting apparatus of claim 11 wherein the mounting peg is integrally formed with the body member.

16. The mounting apparatus of claim 11 wherein the mounting peg has a cylindrical portion, and the peg retention hole in the printed circuit board has a complementary circular shape to engage the mounting peg therein.

17. The mounting apparatus of claim 11 wherein the mounting peg has an overlapping lip and extends from the support shelf, and wherein the ledge is rotatable toward the mounting peg to a peg engaged mode and away from the mounting peg to a peg disengaged mode, the ledge having a ledge hole axially aligned with the mounting peg in the peg engaged mode, and wherein the mounting peg is extendible through the peg retention hole, the lip configured to pass through the ledge hole as the ledge is moved to the peg engaged mode and the lip resisting retraction of the mounting peg from the ledge hole when the ledge is rotated to the peg disengaged mode.

18. An apparatus comprising: a planar circuit board having a component support surface supporting an electrical component, first and second side edges and a peg retention hole extending into the component support surface; and a mounting frame comprising an elongated body member having a rigid support shelf, a flexible ledge, and a stationary retention peg, the support shelf and ledge forming a channel along an overall length of the body member, the stationary retention peg disposed within the channel and extending from the support shelf in a direction toward the ledge, the ledge deflectable responsive to passage of the selected side edge into the channel to facilitate insertion of the stationary retention peg into the peg retention hole to affix the mounting frame to the circuit board; and
the mounting peg has a cylindrical outer surface and an inclined end surface, the inclined end surface inclining toward a direction perpendicular to the entry of the channel.

19. The apparatus of claim 18, in which the mounting frame is a first mounting frame affixed to the first side edge of the circuit board, and the apparatus comprises a second mounting frame nominally identical to the first mounting frame affixed to the second side edge of the circuit board.

20. The apparatus of claim 18, in which the stationary mounting peg is a first mounting peg and the mounting frame further comprises a second mounting peg affixed to the ledge in facing relation to the first mounting peg, the second mounting peg deflected during deflection of the ledge to facilitate insertion of the second mounting peg into the peg retention hole.

21. The apparatus of claim 18, in which the mounting peg has a cylindrical outer surface and an inclined end surface, the inclined end surface in facing relation to the ledge.

* * * * *